US012330349B2

United States Patent
Matsuoka

(10) Patent No.: US 12,330,349 B2
(45) Date of Patent: Jun. 17, 2025

(54) IMPRINT METHOD, IMPRINT APPARATUS, AND METHOD OF MANUFACTURING ARTICLE

(71) Applicant: CANON KABUSHIKI KAISHA, Tokyo (JP)

(72) Inventor: Yoshihiro Matsuoka, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 12 days.

(21) Appl. No.: 17/580,815

(22) Filed: Jan. 21, 2022

(65) Prior Publication Data
US 2022/0242013 A1    Aug. 4, 2022

(30) Foreign Application Priority Data

Jan. 29, 2021    (JP) ................................ 2021-013598

(51) Int. Cl.
*G03F 7/00*    (2006.01)
*B29C 35/08*    (2006.01)
*B29C 59/02*    (2006.01)
*B29C 37/00*    (2006.01)

(52) U.S. Cl.
CPC .......... *B29C 35/0805* (2013.01); *B29C 59/02* (2013.01); *B29C 2037/903* (2013.01)

(58) Field of Classification Search
CPC ................................ G03F 7/0002; G03F 7/00
See application file for complete search history.

(56) References Cited

U.S. PATENT DOCUMENTS

| 2019/0079391 | A1* | 3/2019 | Fukuhara | ............... G03F 7/0002 |
| 2019/0212645 | A1* | 7/2019 | Kusaka | ................. G03F 7/0002 |
| 2019/0358863 | A1* | 11/2019 | Kimura | ............... B29C 35/0805 |

FOREIGN PATENT DOCUMENTS

| JP | 2016058735 | A |   | 4/2016 |
| JP | 2019050313 | A |   | 3/2019 |
| JP | 2019102735 | A |   | 6/2019 |
| JP | 2019204907 | A |   | 11/2019 |
| KR | 20190067091 | A1 | * | 6/2019 |

OTHER PUBLICATIONS

KR 20190067091 A English translation (Year: 2019).*

* cited by examiner

*Primary Examiner* — Larry W Thrower
*Assistant Examiner* — John W Hatch
(74) *Attorney, Agent, or Firm* — ROSSI, KIMMS & McDOWELL LLP

(57) ABSTRACT

The present invention provides an imprint method of forming a pattern of an imprint material on a substrate using a mold, comprising: performing preliminary curing in which the imprint material is cured to a first target hardness by irradiating the imprint material with first light, in order to execute alignment between the mold and the substrate; and performing, after the alignment, main curing in which the imprint material is cured to a second target hardness by irradiating the imprint material with second light, wherein before performing the preliminary curing, an irradiation light amount of the first light to be used in the preliminary curing is determined based on a curing time until the imprint material is cured to the first target hardness, the curing time being obtained by irradiating an imprint material with third light.

17 Claims, 8 Drawing Sheets

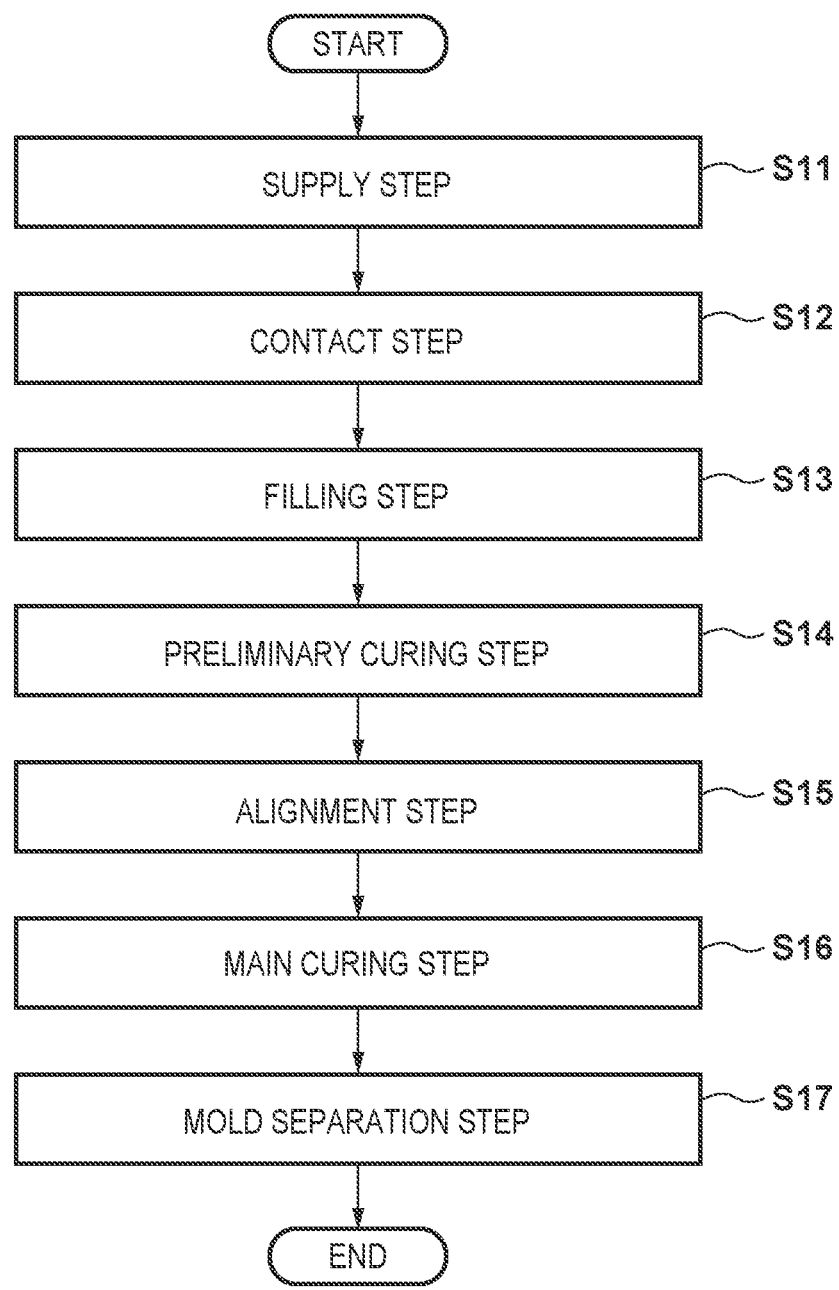

IMPRINT METHOD, IMPRINT APPARATUS, AND METHOD OF MANUFACTURING ARTICLE

BACKGROUND OF THE INVENTION

Field of the Invention

The present invention relates to an imprint method, an imprint apparatus, and a method of manufacturing an article.

Description of the Related Art

As a technique for manufacturing a semiconductor device, a MEMS, and the like, there is known an imprint technique for forming a pattern of an imprint material on a substrate using a mold. In the imprint technique, a liquid imprint material is supplied onto a substrate, and a mold is brought into contact with the imprint material on the substrate. After that, the imprint material is cured in that state, and the mold is separated from the cured imprint material. This can form the pattern of the imprint material on the substrate.

In the imprint technique, before curing the imprint material, alignment between the mold and the substrate is executed in a state in which the mold is in contact with the imprint material on the substrate. In the alignment, the alignment accuracy between the mold and the substrate may deteriorate due to the influence of disturbance such as a vibration from the floor on which an imprint apparatus is installed. Japanese Patent Laid-Open No. 2016-58735 proposes a method of improving the alignment accuracy in alignment between a mold and a substrate by performing preliminary curing (preliminary exposure) in which the imprint material is irradiated with light to increase the viscosity of the imprint material.

When curing the imprint material to a target hardness in preliminary curing (preliminary exposure), a higher illuminance (light intensity) of light with which the imprint material is irradiated is advantageous in terms of throughput since the curing rate of the imprint material is higher and the time required for preliminary curing is thus shortened. On the other hand, if the illuminance of light in preliminary curing is applied when determining the irradiation light amount for curing the imprint material to the target hardness, the viscosity of the imprint material quickly changes and it can thus be difficult to accurately determine the irradiation light amount.

SUMMARY OF THE INVENTION

The present invention provides, for example, a technique advantageous in determining an irradiation light amount for preliminarily curing an imprint material.

According to one aspect of the present invention, there is provided an imprint method of forming a pattern of an imprint material on a substrate using a mold, comprising: performing preliminary curing in which the imprint material is cured to a first target hardness by irradiating the imprint material with first light, in order to execute alignment between the mold and the substrate; and performing, after the alignment, main curing in which the imprint material is cured to a second target hardness higher than the first target hardness by irradiating the imprint material with second light, wherein before performing the preliminary curing, an irradiation light amount of the first light to be used in the preliminary curing is determined based on a curing time until the imprint material is cured to the first target hardness, the curing time being obtained by irradiating an imprint material with third light having an illuminance lower than an illuminance of the first light.

Further features of the present invention will become apparent from the following description of exemplary embodiments with reference to the attached drawings.

BRIEF DESCRIPTION OF THE DRAWINGS

FIG. 2 is a flowchart illustrating an imprint process;

DESCRIPTION OF THE EMBODIMENTS

Figure 1:
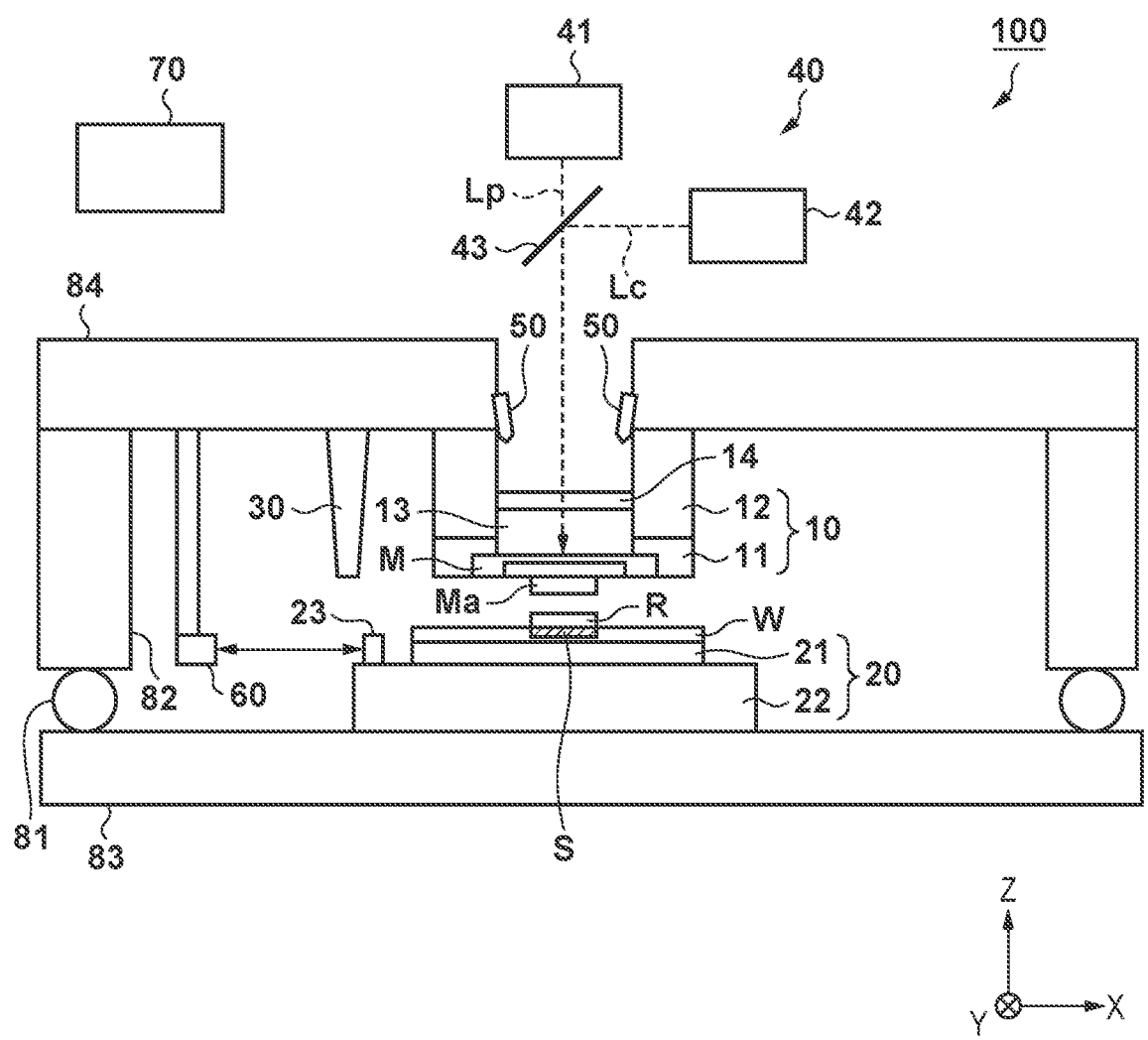
FIG. 1 is a schematic view showing an example of the arrangement of an imprint apparatus 100.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

The first embodiment of the present invention will be described. An imprint apparatus is an apparatus that brings a mold into contact with an imprint material supplied onto a substrate and gives energy for curing to the imprint material, thereby forming the pattern of a cured product to which the uneven pattern of the mold is transferred. For example, the imprint apparatus supplies a liquid imprint material onto a substrate, and cures the imprint material in a state in which a mold on which an uneven pattern has been formed is in contact with the imprint material on the substrate. Then, the imprint apparatus increases the interval between the mold and the substrate to separate (mold separation) the mold from the cured imprint material, thereby transferring the pattern of the mold to the imprint material on the substrate. The series of processes is called an "imprint process", and is performed for each of a plurality of shot regions on the substrate.

As the imprint material, a curable composition (to be sometimes referred to as a resin in an uncured state hereinafter) to be cured by energy for curing is used. As the energy for curing, an electromagnetic wave, heat, or the like is used. The electromagnetic wave is, for example, light such as infrared rays, visible light, or UV rays whose wavelength is selected from the range of 10 nm (inclusive) to 1 mm (inclusive).

The curable composition is a composition cured by light irradiation or heating. A photo-curable composition cured by light contains at least a polymerizable compound and a photopolymerization initiator, and may contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component.

The imprint material is applied in a film shape onto the substrate by a spin coater or a slit coater. Alternatively, the imprint material may be applied, onto the substrate, in a droplet shape or in an island or film shape formed by connecting a plurality of droplets using a liquid injection head. The viscosity (viscosity at 25° C.) of the imprint material is, for example, 1 mPa·s (inclusive) to 100 mPa·s (inclusive).

[Arrangement of Imprint Apparatus]

FIG. 1 is a schematic view showing an example of the arrangement of an imprint apparatus 100 according to this embodiment. The imprint apparatus 100 according to this embodiment can include, for example, an imprint head 10 (mold holding unit), a substrate stage 20, a supply unit 30, a curing unit 40, measurement units 50, a detection unit 60, and a control unit 70. The control unit 70 is formed by a computer including a CPU and a memory, and is connected to each unit of the imprint apparatus 100 via a line to control each unit of the imprint apparatus 100 (control an imprint process) in accordance with a program and the like. In this example, the imprint head 10 is fixed to a bridge surface plate 84 supported by a base surface plate 83 via vibration isolators 81 and columns 82, and the substrate stage 20 is configured to be movable on the base surface plate 83. Each vibration isolator 81 is, for example, a mechanism for reducing a vibration transmitted to the bridge surface plate 84 from the floor on which the imprint apparatus 100 is installed.

A mold M is usually made of a material such as quartz that can transmit UV rays. In a partial region (pattern region Ma) protruding toward the substrate side on the substrate side surface, an uneven pattern to be transferred to an imprint material R on a substrate is formed. As a substrate W, glass, ceramic, a metal, a semiconductor, a resin, or the like is used, and a member made of a material different from that of the substrate may be formed on the surface of the substrate, as needed. More specifically, the substrate W is a silicon wafer, a semiconductor compound wafer, silica glass, or the like. An adhesion layer may be provided to improve the adhesion between the imprint material and the substrate, as needed, before the application of the imprint material.

The imprint head 10 can include a mold chuck 11 that holds the mold M by, for example, a vacuum force or the like, and a mold driving unit 12 that drives the mold M (mold chuck 11) in the Z direction so as to change the interval between the mold M and the substrate W. By driving the mold M in the Z direction by the imprint head 10, it is possible to execute a contact process of bringing the mold M into contact with the imprint material R on the substrate and a mold separation process of separating the mold M from the cured imprint material R. The driving direction is not limited to the Z direction, and the imprint head 10 may be configured to drive the mold M in the X and Y directions and the θ direction (the rotation direction around the Z-axis).

In the imprint head 10 according to this embodiment, a space 13 through which light emitted from the curing unit 40 passes is provided. This space 13 is partitioned by a light transmitting member 14, and is a substantially sealed space when the mold M is held by the imprint head 10 (mold chuck 11). Therefore, in the contact process or the mold separation process, by adjusting the internal pressure in the space 13 by a pressure adjustment unit (not shown), it is possible to deform the mold M (pattern region Ma) into such a convex shape that the central portion of the mold M protrudes toward the substrate W. For example, by deforming the mold M into the convex shape in the contact process, the pattern region Ma can be gradually brought into contact with the imprint material R to reduce trapping of a gas in the concave portion of the pattern formed on the mold M.

The substrate stage 20 can include a substrate chuck 21 that holds a substrate by, for example, a vacuum force or the like, and a moving unit 22 that can move in the X and Y directions on the base surface plate 83. When the substrate stage 20 (moving unit 22) is moved in the X and Y directions, the substrate W can be driven in the X and Y directions, thereby positioning (relative position) the mold M and the substrate W and positioning the supply unit 30 and the substrate W. The driving directions are not limited to the X and Y directions, and the substrate stage 20 may be configured to drive the substrate W in the Z direction and the θ direction.

The supply unit 30 (a discharge unit or a dispenser) supplies the imprint material R onto the substrate arranged below the supply unit 30 by the substrate stage 20. In this embodiment, a resin that undergoes a polymerization reaction by light irradiation is used as the imprint material R. For example, the supply unit 30 can supply the imprint material R onto the substrate W (a target shot region S) by discharging the imprint material R as a plurality of droplets in a state in which the substrate W is relatively moved with respect to the supply unit 30 by the substrate stage 20.

The curing unit 40 (light irradiation unit) irradiates the imprint material R on the substrate W with light, thereby curing the imprint material. The curing unit 40 according to this embodiment can include, for example, a preliminary curing unit 41 and a main curing unit 42. The preliminary curing unit 41 includes a light source that emits first light (to be sometimes referred to as preliminary curing light Lp hereinafter) for curing the imprint material R to the first target hardness in a preliminary curing step (to be described later). The preliminary curing light Lp emitted from the preliminary curing unit 41 is transmitted through a half mirror 43 to irradiate the imprint material R on the substrate. The main curing unit 42 includes a light source that emits second light (to be sometimes referred to as main curing light Lc hereinafter) for curing the imprint material to the second target hardness in a main curing step (to be described later). The main curing light Lc emitted from the main curing unit 42 is reflected by the half mirror 43 to irradiate the imprint material R on the substrate. The half mirror 43 can be formed by a dichroic mirror or the like that transmits the preliminary curing light Lp and reflects the main curing light Lc.

The illuminance (light intensity) of the preliminary curing light Lp can be set to, for example, an illuminance equal to or lower than the illuminance of the main curing light Lc, but is preferably set to an illuminance almost equal to the illuminance of the main curing light Lc in this embodiment from the viewpoint of throughput. The wavelengths (wavelength ranges) of the preliminary curing light Lp and the main curing light Lc can arbitrarily be set in accordance with the reaction sensitivity of the imprint material R, and may be the same or different from each other. In this embodiment, the preliminary curing unit 41 and the main curing unit 42 are separately provided. The present invention, however, is not limited to this, and the preliminary curing unit 41 and the main curing unit 42 may be provided integrally.

In this example, the second target hardness of the imprint material R in the main curing step can be defined as the degree of cure at which the imprint material R can be solidified. For example, the second target hardness can be defined as the degree of cure of the imprint material R at which, even after the mold M is separated from the imprint material R in the mold separation step, the pattern shape of the imprint material R obtained by transferring the uneven pattern of the mold M can be maintained. The second target hardness is set to a hardness higher than the first target hardness to which the imprint material R is cured in the preliminary curing step.

The first target hardness of the imprint material R in the preliminary curing step can be defined as the degree of cure of the imprint material R higher than the hardness (viscosity) of the imprint material R at the time of supply from the supply unit 30 onto the substrate but lower than the second target hardness. That is, the first target hardness can be defined as the degree of cure of the imprint material R having the fluidity higher than that of the second target hardness but lower than that of the imprint material R at the time of supply from the supply unit 30 onto the substrate. As long as the mold M and the substrate W can be relatively driven in a state in which the mold M is in contact with the imprint material R on the substrate, the first target hardness can arbitrarily be set within a range higher than the hardness of the imprint material R at the time of supply onto the substrate and lower than the second target hardness. For example, the first target hardness can be set to a value within a range of 20% to 80% of the second target hardness, preferably a value within a range of 20% to 40% of the second target hardness.

Each measurement unit 50 includes, for example, a TTM (Through The Mold) scope that detects a mark provided on the mold M and a mark provided on the substrate W, and measures the positions of the mark of the mold M and that of the substrate W. This allows the control unit 70 to control alignment between the mold M and the substrate W based on the relative position between the mark of the mold M and that of the substrate W measured by the measurement units 50.

The detection unit 60 detects the relative position between the mold M and the substrate W in the X and Y directions. In this embodiment, the detection unit 60 is fixed to the bridge surface plate 84 to which the imprint head 10 (mold M) is fixed, and is configured to detect the position of the substrate stage 20 in the X and Y directions. For example, the detection unit 60 includes a laser interferometer, and irradiates a reflecting plate 23 provided on the substrate stage 20 with a laser beam to detect the position of the substrate stage 20 using the laser bean reflected by the reflecting plate 23. In this way, the detection unit 60 can detect the position of the substrate stage 20 in the X and Y directions and then detect the relative position between the imprint head 10 (mold M) and the substrate stage 20 (substrate W) based on the detection result. Furthermore, the detection unit 60 may be configured to detect the position of the imprint head 10 (mold M) in addition to the position of the substrate stage 20.

[Imprint Process]

Next, the imprint process performed in the imprint apparatus 100 according to this embodiment will be described. FIG. 2 is a flowchart illustrating the imprint process performed for one shot region on the substrate. Each step of the flowchart shown in FIG. 2 can be controlled by the control unit 70.

In step S11, the control unit 70 causes the supply unit 30 to discharge the imprint material R while causing the substrate stage 20 to relatively move the supply unit 30 and the substrate W, thereby supplying the imprint material R onto a shot region (supply step). When the supply step ends, the control unit 70 causes the substrate stage 20 to drive the substrate W so as to arrange the shot region below the mold M (pattern region Ma). In step S12, the control unit 70 causes the imprint head 10 to drive the mold M in the −Z direction to decrease the interval between the mold M and the substrate W, thereby bringing the mold M into contact with the imprint material R on the substrate (contact step). Next, in step S13, the control unit 70 stands by until a predetermined time elapses so as to allow the concave portion of the pattern of the mold M to be filled with the imprint material R (filling step).

In step S14, the control unit 70 causes the curing unit 40 (preliminary curing unit 41) to irradiate the imprint material R with the preliminary curing light Lp in a state in which the mold M is in contact with the imprint material R, thereby curing the imprint material R to the first target hardness (preliminary curing step). In the preliminary curing step, for example, the imprint material R is irradiated continuously with the preliminary curing light Lp. In step S15, the control unit 70 executes alignment between the mold M and the substrate W in the state in which the mold M is in contact with the imprint material R (alignment step). In the alignment step, the measurement units 50 are caused to measure the relative position between the mark of the mold M and that of the substrate W, and the relative position between the mold M and the substrate W can be controlled based on the measurement result so as to set the mark of the mold M and that of the substrate W to the target relative position.

In step S16, the control unit 70 causes the curing unit 40 (main curing unit 42) to irradiate the imprint material R with the main curing light Lc in the state in which the mold M is in contact with the imprint material R on the substrate, thereby curing the imprint material R to the second target hardness (main curing step). In the main curing step, for example, the imprint material R is irradiated continuously with the main curing light Lc. Next, in step S17, the control unit 70 causes the imprint head 10 to drive the mold M in the +Z direction to increase the interval between the mold M and the substrate W, thereby separating the mold M from the imprint material R cured to the second target hardness (mold separation step).

In FIG. 2, the alignment step (S15) is performed between the preliminary curing step (S14) and the main curing step (S16) but may be performed in parallel with at least part of the period of the preliminary curing step (S14). That is, the alignment step (S15) can be performed during at least part of the period from the start of the preliminary curing step (S14) to the start of the main curing step (S16).

[Preliminary Curing Step]

In the contact step (S12) and the filling step (S13) of the above-described imprint process, the imprint material R preferably has a low viscosity (that is, high fluidity) in order to make it easy for the imprint material R to spread on the substrate. On the other hand, in the alignment step (S15), since the alignment accuracy between the mold M and the substrate W can deteriorate due to the influence of disturbance such as a vibration from the floor, it is preferable to increase the viscosity of the imprint material R to reduce the influence of the disturbance. Therefore, in the imprint process according to this embodiment, the preliminary curing step (S14) of curing the imprint material R to the first target hardness is performed by irradiating the imprint material R on the substrate with the preliminary curing light Lp. This can make it difficult to change the relative position between the mold M and the substrate W in the alignment step, thereby improving the alignment accuracy between the mold M and the substrate W.

Figure 3A:
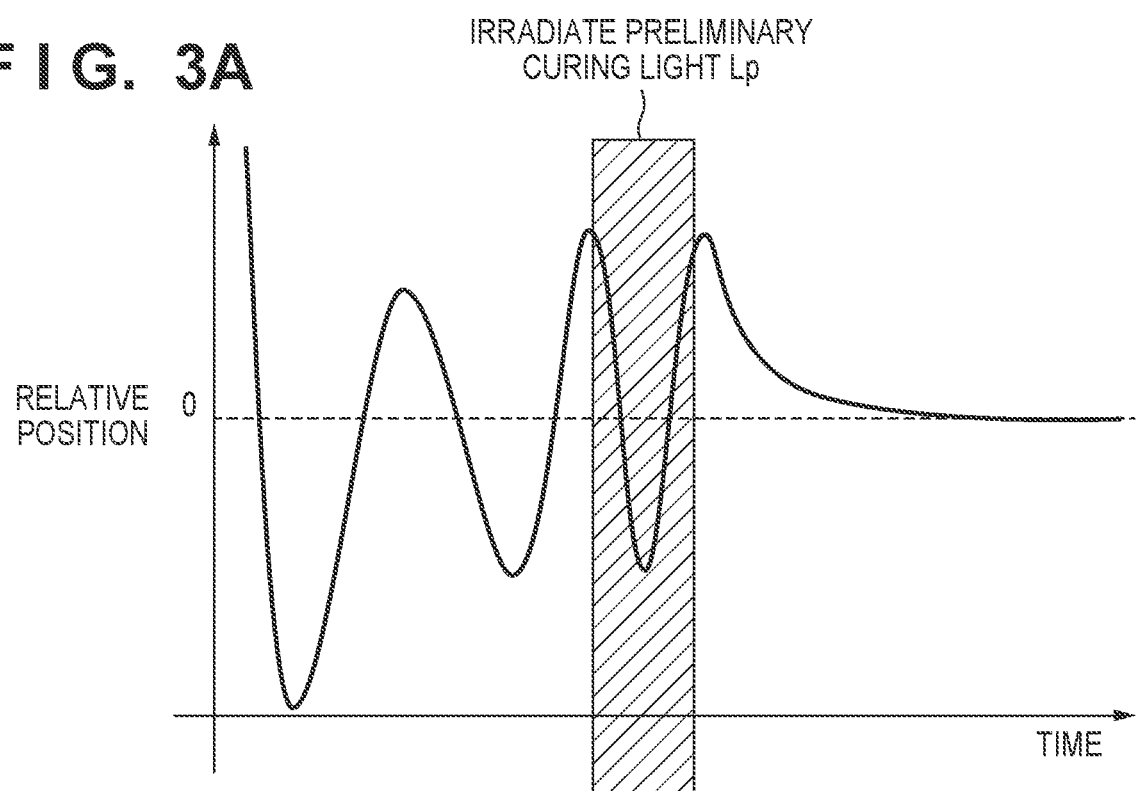
FIGS. 3A and 3B are timing charts for explaining the influence (effect) of a preliminary curing step on an alignment step.
Figure 3B:
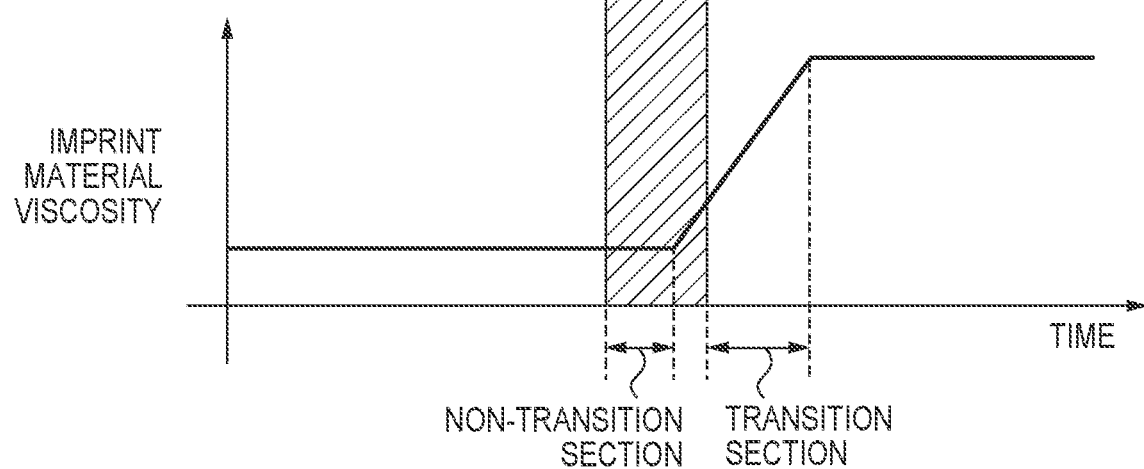

FIGS. 3A and 3B are timing charts for explaining the influence (effect) of the preliminary curing step (S14) on the alignment step (S15). FIG. 3A shows the relative position (a deviation with respect to the target relative position (zero in FIG. 3A)) between the mold M and the substrate W detected by the detection unit 60 in the alignment step (S15), and FIG. 3B shows the viscosity (hardness) of the imprint material R. As shown in FIG. 3B, the imprint material R has a viscosity that hardly changes during a predetermined period (called a "non-transition section" (dead section)) after the start of irradiation with the preliminary curing light Lp and starts to increase after the predetermined period. Then, before the imprint material R is cured completely, that is, in a state in which such fluidity that it is possible to change the relative position between the mold M and the substrate W is held, irradiation with the preliminary curing light Lp ends. In this state, it is difficult to change the relative position between the mold M and the substrate W. However, since the influence of disturbance such as a vibration from the floor can be reduced, it is possible to improve the alignment accuracy between the mold M and the substrate W, as shown in FIG. 3A. Note that the viscosity of the imprint material R may increase as a transient response even after the end of irradiation with the preliminary curing light Lp, and this period is called a transition section.

[Method of Determining Irradiation Light Amount of Preliminary Curing Light]

When the imprint material R is cured to the first target hardness in the preliminary curing step (S14), since, as the illuminance of the preliminary curing light Lp is higher, the curing rate of the imprint material R is higher, and the time required for the preliminary curing step is thus decreased, the higher illuminance is advantageous in terms of throughput. On the other hand, when determining the irradiation light amount of the preliminary curing light Lp to cure the imprint material R to the first target hardness, if the illuminance (that is, the illuminance of the preliminary curing light Lp) used in the preliminary curing step is applied, the viscosity of the imprint material R can quickly change. In this case, since it is impossible to accurately obtain the timing at which the imprint material R is set to the first target hardness, it can be difficult to accurately determine the irradiation light amount.

Figure 4:
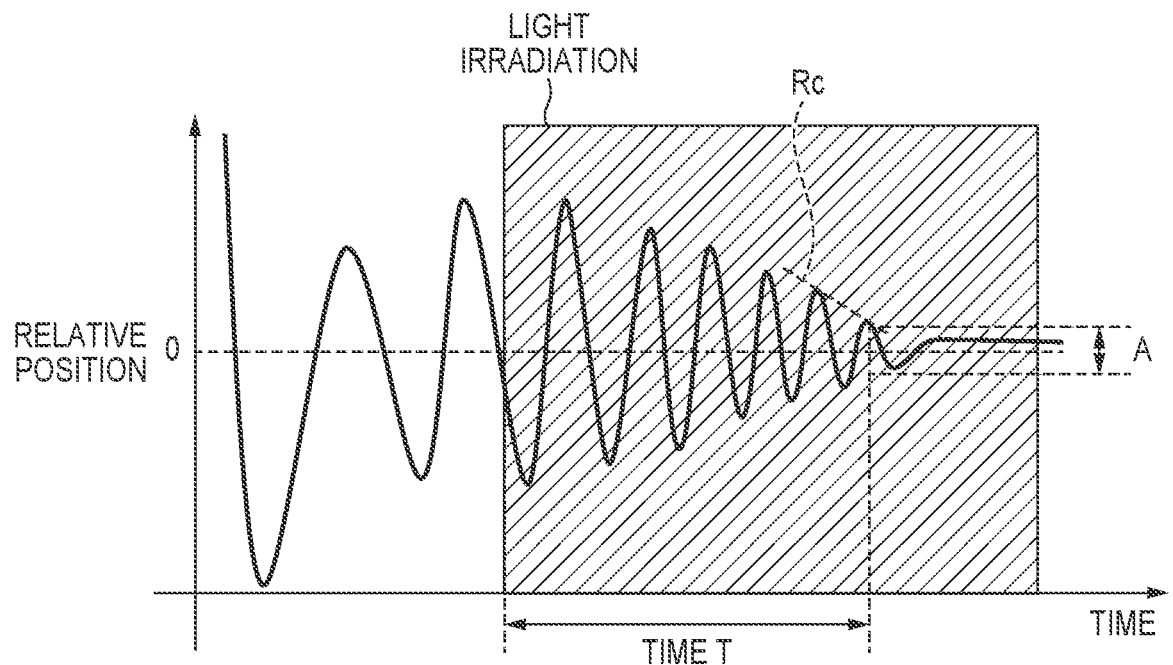
FIG. 4 is a timing chart for explaining a determination process.

In this embodiment, based on a result of executing alignment between the mold M and the substrate W while irradiating the imprint material R with light until the imprint material R is cured completely (that is, to the second target hardness), the irradiation light amount of the preliminary curing light Lp is determined. In this determination process, as shown in FIG. 4, the detection unit 60 is caused to detect the relative position between the mold M and the substrate W while irradiating the imprint material R with light, and then a time T until the imprint material R is cured to the first target hardness is obtained based on the detection result (the waveform of the relative position). This can determine the irradiation light amount of the preliminary curing light Lp based on the time T and the illuminance of the light with which the imprint material R is irradiated (for example, based on the product of the time T and the illuminance of the light).

As shown in FIG. 4, the time T may be defined as the time until the relative position (the deviation with respect to the target relative position) falls within an allowable range A. The allowable range A can be set to, for example, a range from an absolute value of 0.1 nm (inclusive) to an absolute value of 10 nm (inclusive). Furthermore, as shown in FIG. 4, the time T may be defined as the time from the start of light irradiation until a change rate Rc (for example, the rate between two successive peak values) of an amplitude in the waveform of the relative position becomes a target value. Since the viscosity of the imprint material R increases due to light irradiation, it accordingly becomes difficult to change the relative position between the mold M and the substrate W, and the change rate Rc of the amplitude in the waveform of the relative position also changes. That is, since the viscosity of the imprint material R shown in FIG. 3B is reflected on the change rate Rc, the change rate Rc can be obtained in advance by a pre-experiment or pre-simulation by setting, as the target value, the change rate Rc obtained when the imprint material R is set to the first target hardness.

Figure 5:
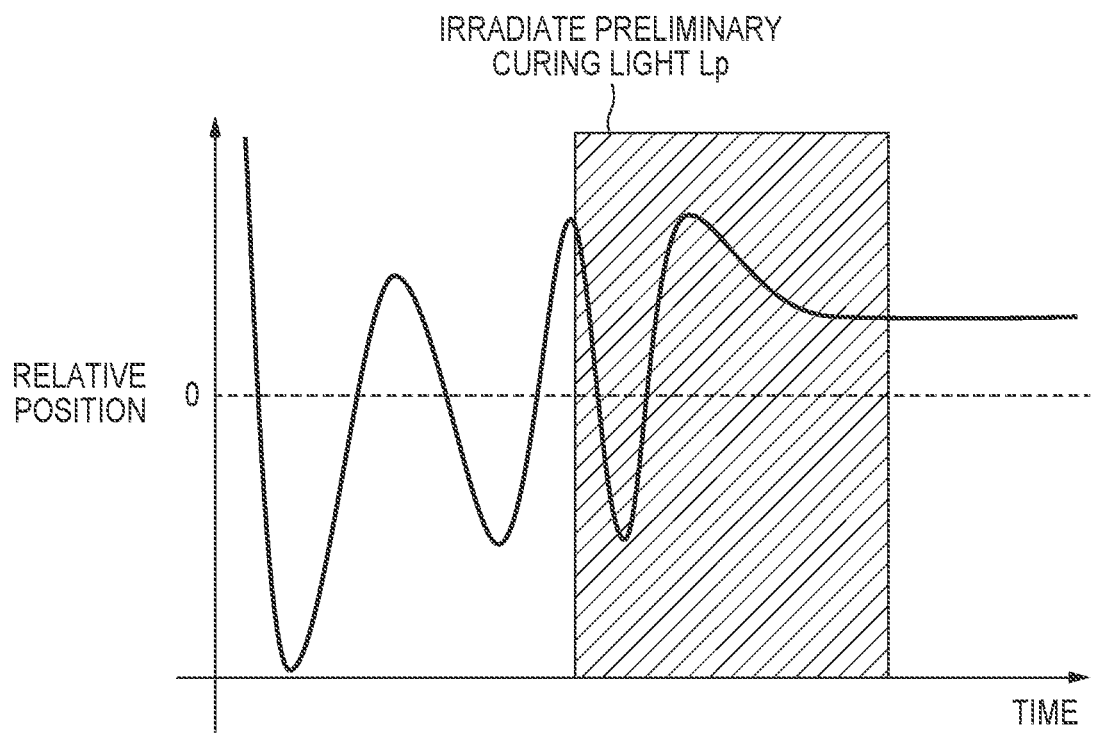
FIG. 5 is a timing chart for explaining the influence of using preliminary curing light for the determination process.

If the preliminary curing light Lp is used in the determination process, the viscosity of the imprint material R quickly changes, and the imprint material R is unwantedly cured completely (that is, to a state in which the relative position cannot be changed) in a state in which the deviation of the relative position does not fall the allowable range, as shown in FIG. 5. In this case, for the shot region used to determine the irradiation light amount of the preliminary curing light Lp, the pattern of the mold M cannot be accurately transferred, thereby making it difficult to provide the substrate as a product. That is, it can be difficult to determine the irradiation light amount of the preliminary curing light Lp using the shot region on the substrate to be provided as a product.

To cope with this, in this embodiment, in the above-described determination process, the third light (to be sometimes referred to as low illuminance light Ls hereinafter) having an illuminance lower than that of the preliminary curing light Lp (first light) is used to determine the irradiation light amount (target irradiation light amount) of the preliminary curing light Lp in the preliminary curing step. In this case, the illuminance of the low illuminance light Ls can be set to, for example, a value within a range of 5% to 50% of the illuminance of the preliminary curing light Lp, and preferably a range of 15% to 40% of the illuminance of the preliminary curing light Lp. Furthermore, the irradiation light amount of the preliminary curing light Lp is defined as the integrated exposure amount of the preliminary curing light Lp with respect to the imprint material R, and can be represented by the time integration (for example, the product of the irradiation time and the illuminance of the preliminary curing light Lp) of the illuminance of the preliminary curing light Lp with which the imprint material R is irradiated.

The determination process according to this embodiment will be described below. In the determination process according to this embodiment, a curing time Ts until the imprint material R is cured to the first target hardness by irradiating the imprint material R with the low illuminance light Ls is obtained, and then the irradiation light amount of the preliminary curing light Lp in the preliminary curing step is determined based on the curing time Ts. The curing time Ts can be obtained based on, for example, a result of causing the detection unit 60 to detect the relative position between the mold M and the substrate W while irradiating the imprint material R on a predetermined region of the substrate W with the low illuminance light Ls.

The predetermined region may be a region (that is, a region on the same substrate as that of the target region) on the substrate having the target region (shot region) for which the preliminary curing step is performed using the preliminary curing light Lp, or a region on a substrate different from the substrate having the target region. In this embodiment, the predetermined region can be a specific shot region selected from the plurality of shot regions on the substrate W. The specific shot region may include a shot region (that is, the shot region for which the imprint process is performed first) on which the pattern is formed first, among the plurality of shot regions on the substrate W. Furthermore, the specific shot region may include a shot region for which the imprint process is performed first after a predetermined time elapses since the target light amount of the preliminary curing light Lp is determined last.

Figure 6A:
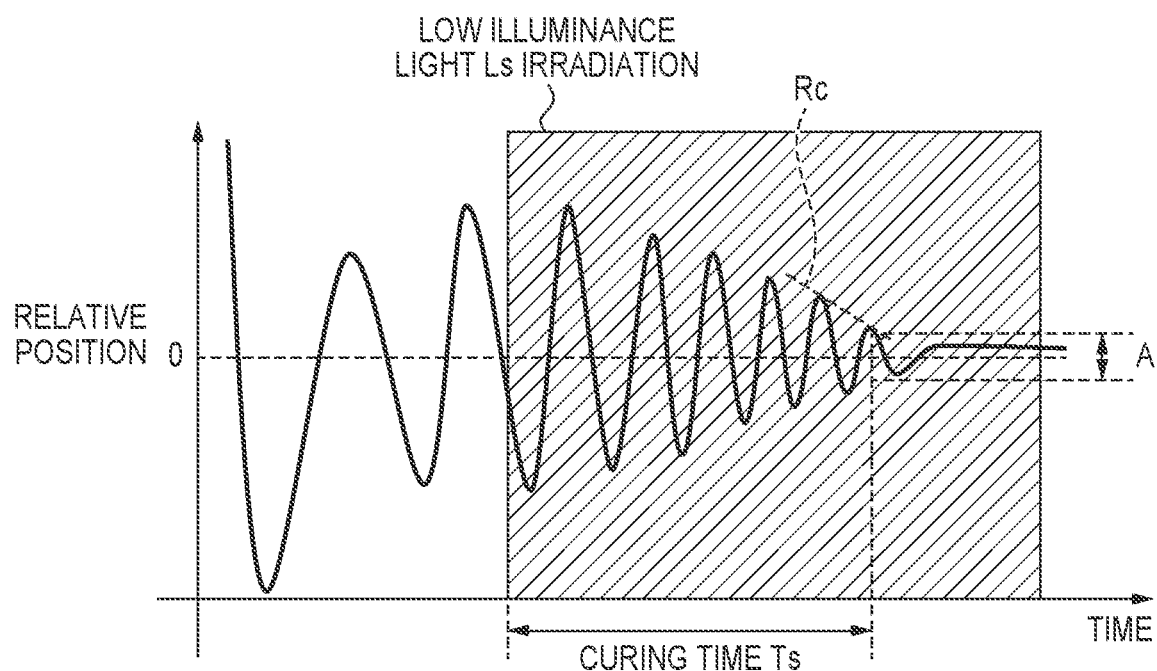
FIGS. 6A and 6B are timing charts for explaining a determination process according to the first embodiment.

FIG. 6A is a timing chart showing a result of causing the detection unit 60 to detect the relative position between the mold M and the predetermined region while irradiating the imprint material R on the predetermined region with the low illuminance light Ls. Similar to the above-described determination process, the detection unit 60 is caused to detect the relative position between the mold M and the predetermined region while irradiating the imprint material R on the predetermined region with the low illuminance light Ls. This acquires, as information indicating the relationship between the relative position and the irradiation time of the low illuminance light Ls, the waveform of the relative position shown in FIG. 6A. Then, based on the information (the waveform of the relative position), the curing time Ts until the imprint material R is cured to the first target hardness is obtained. As described above, the curing time Ts may be defined as the time until the deviation of the relative position falls within the allowable range A or the time until the change rate Rc of the amplitude in the waveform of the relative position becomes the target value.

By obtaining the curing time Ts in this way, it is possible to determine, based on the curing time Ts, the irradiation light amount of the preliminary curing light Lp in the preliminary curing step. For example, an irradiation time Tp of the preliminary curing light Lp in the preliminary curing step can be determined as the irradiation light amount based on the curing time Ts, the illuminance of the low illuminance light Ls, and the illuminance of the preliminary curing light Lp. More specifically, if the imprint material is a single molecule sequential photoreaction system, the reaction rate with respect to the irradiation light amount is proportional to illuminance×time. Therefore, when Is represents the illuminance of the low illuminance light Ls and Ip represents the illuminance of the preliminary curing light Lp, the irradiation time Tp can be determined by Tp=(Is/Ip)×Ts. Furthermore, if the imprint material is a photo radical polymerization reaction system, the reaction rate with respect to the irradiation light amount is proportional to √(illuminance)× time, and thus the irradiation time Tp can be determined by Tp=√(Is/Ip)×Ts.

Figure 6B:
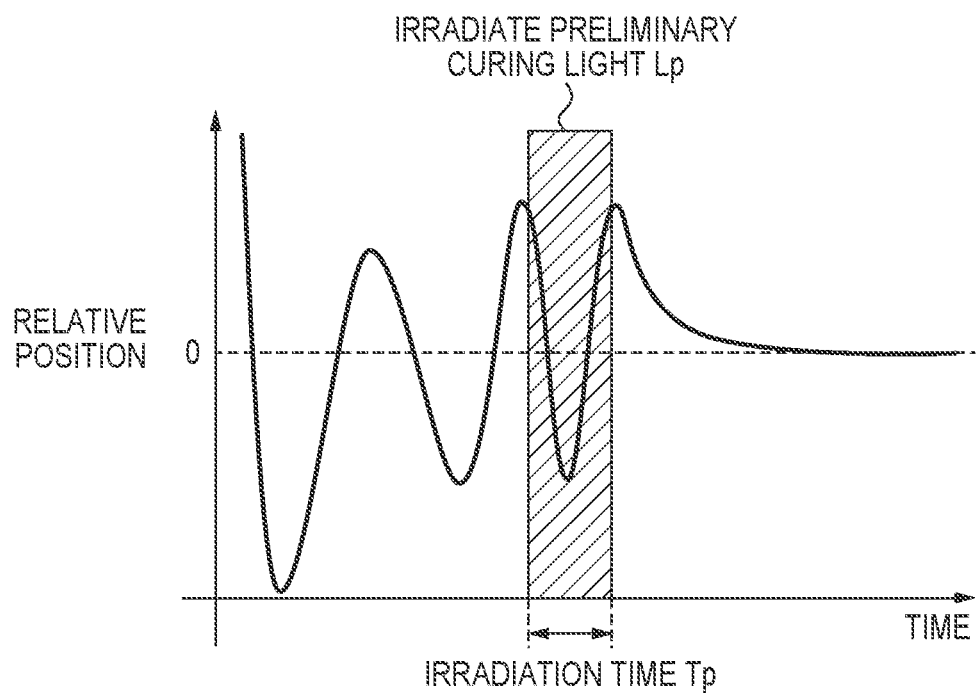

FIG. 6B shows the time-series waveform of the relative position between the mold M and the substrate W when the preliminary curing step is performed with the irradiation time Tp (irradiation light amount) of the preliminary curing light Lp determined as described above. By using the irradiation time Tp determined as described above, it is possible to accurately control (adjust) the viscosity of the imprint material R, that is, accurately cure the imprint material R to the first target hardness. That is, in the preliminary curing step, it is possible to avoid an event that the imprint material R is cured to the extent that it is impossible to change the relative position between the mold M and the substrate W, thereby accurately executing alignment between the mold M and the substrate W.

Figure 7:
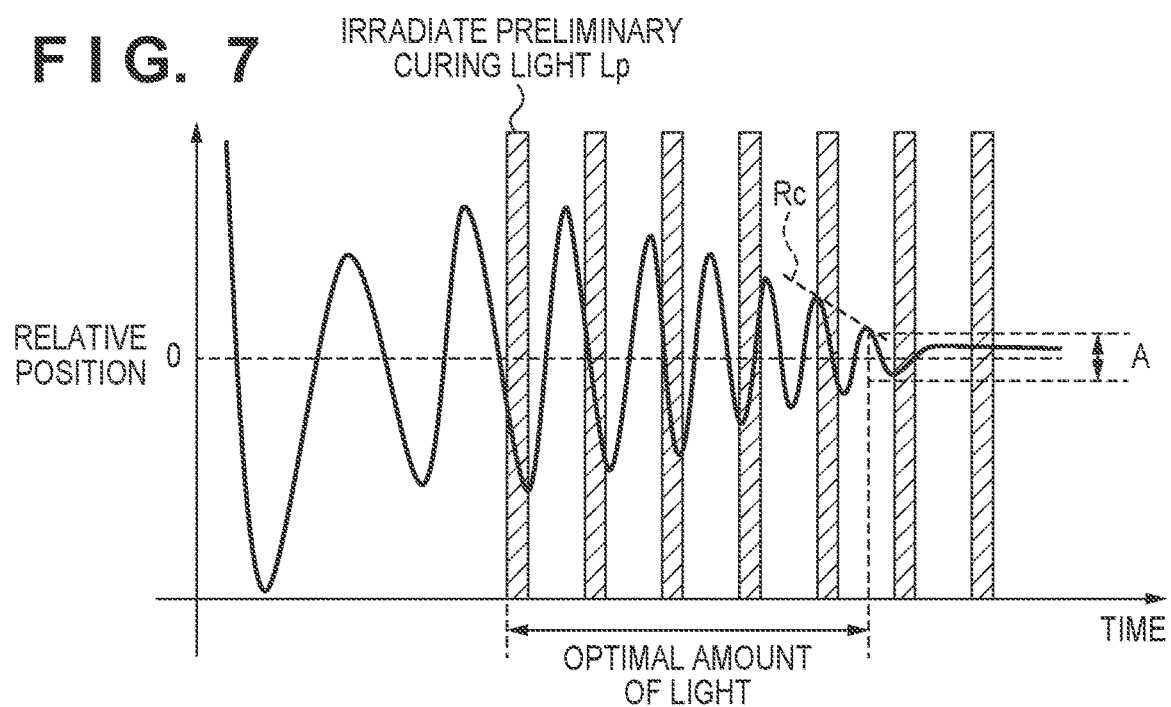
FIG. 7 is a timing chart for explaining a modification of the determination process according to the first embodiment.

In the above example, the curing time Ts until the imprint material R is cured to the first target hardness is obtained using the low illuminance light Ls. However, as shown in FIG. 7, the curing time Ts can also be obtained by discretely irradiating the imprint material R with the preliminary curing light Lp. That is, irradiation of the imprint material R with the preliminary curing light Lp is intermittently performed a plurality of times at intervals. In this case, the curing time Ts is an integrated value of the time of irradiation with the preliminary curing light Lp until the deviation of the relative position falls within the allowable range A or an integrated value of the time of irradiation with the preliminary curing light Lp until the change rate Rc of the amplitude in the waveform of the relative position becomes the target value.

[Imprint Method]

Figure 8:
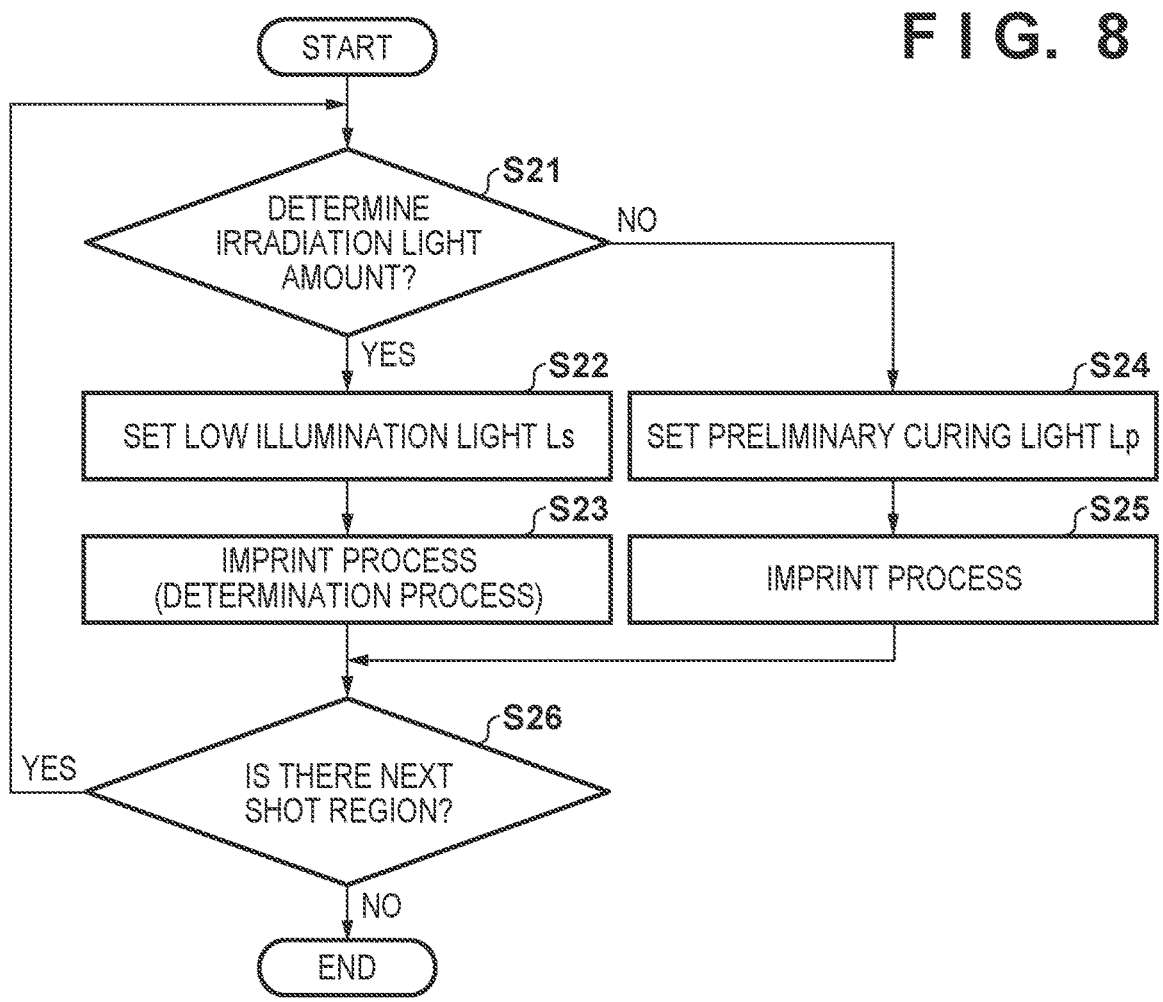
FIG. 8 is a flowchart illustrating an imprint method according to the first embodiment.

An imprint method according to this embodiment will be described next. FIG. 8 is a flowchart illustrating the imprint method according to this embodiment. Each step of the flowchart shown in FIG. 8 can be controlled by the control unit 70. This embodiment will describe an example of determining, using one of the plurality of shot regions on the substrate W, the irradiation light amount of the preliminary curing light Lp commonly applied in the preliminary curing step for each of the plurality of shot regions.

In step S21, the control unit 70 judges whether to determine (optimize) the irradiation light amount of the preliminary curing light Lp using the target shot region for which the imprint process is to be performed. For example, if the target shot region is a shot region for which the imprint process is performed first, among the plurality of shot regions on the substrate W, the control unit 70 may judge to determine the irradiation light amount of the preliminary curing light Lp. Alternatively, if a predetermined time elapses since the target light amount of the preliminary curing light Lp is determined last, the control unit 70 may judge to determine the irradiation light amount of the preliminary curing light Lp. If the control unit 70 judges to determine the irradiation light amount of the preliminary curing light Lp using the target shot region, the process advances to step S22; otherwise, the process advances to step S24.

Steps S22 and S23 correspond to a determination step of determining the irradiation light amount of the preliminary curing light Lp, and the above-described determination process can be applied in the imprint process of the target shot region. In step S22, the control unit 70 sets the low illuminance light Ls as light to be used in the preliminary curing step (S14). In step S23, the control unit 70 performs the imprint process for the target shot region. The imprint process can be performed in accordance with the flowchart shown in FIG. 2 but the above-described determination method is performed instead of the preliminary curing step (S14). This determines the irradiation light amount (irradiation time Tp) of the preliminary curing light Lp.

Steps S24 and S25 correspond to a step of performing the imprint process using the preliminary curing light Lp. In step S24, the control unit 70 sets the preliminary curing light Lp as light to be used in the preliminary curing step (S14). In step S25, the control unit 70 performs the imprint process for the target shot region. The imprint process can be performed in accordance with the flowchart shown in FIG. 2.

In step S26, the control unit 70 judges whether there is a shot region (next shot region) on the substrate, for which the imprint process is to be performed next. If there is the next shot region, the process advances to step S21; otherwise, the process ends.

[Switching Between Preliminary Curing Light and Low Illuminance Light]

A method of switching between the preliminary curing light Lp and the low illuminance light Ls will be described next. Switching between the preliminary curing light Lp and the low illuminance light Ls can be implemented by switching the output of the light source of the preliminary curing unit 41 or switching an optical filter provided in the preliminary curing unit 41. Alternatively, this can be implemented by providing a plurality of light sources, a plurality of optical paths, or both the light source and the optical path.

For example, by performing duty control of the preliminary curing light Lp, the low illuminance light Ls can be generated. In this case, a mechanism capable of spatially and temporally controlling the illuminance distribution of an imprint region with respect to light from the light source may be provided. An example of the mechanism capable of spatially controlling the illuminance distribution of light is a DMD (Digital Micro-mirror Device). Furthermore, an element other than the DMD may be used as long as the element can emit light having an illuminance distribution with respect to the shot region (imprint region) similar to the DMD. For example, an LCD (Liquid Crystal Display) can be used. If the DMD is used, it is possible to obtain a time response quicker than ON/OFF control by current control of the light source. While the transient response speed of the light source is about several hundred μsec, pattern switching control of the DMD is sufficiently quick and switching is possible in several tens of μsec. By switching the duty ratio of irradiation using this characteristic, it is possible to control an irradiation amount per unit time. Thus, a substantial illuminance can be switched without changing the illuminance of the light source. Furthermore, since the DMD can control the illuminance distribution of the shot region, a substantial illuminance can be switched by switching the area amount of irradiation with light. In these cases, if there is no large difference in substantial illuminance with respect to the original high illuminance (for example, the preliminary curing light Lp), a viscosity change is not moderate. If the substantial illuminance is too small with respect to the original high illuminance (for example, the preliminary curing light Lp), the irradiation time becomes too long and is not practical. For these reasons, when implementing a low illuminance (for example, the low illuminance light Ls), an illuminance of 5% (inclusive) to 50% (inclusive) of the high illuminance (preliminary curing light Lp) is desirable.

As described above, the imprint apparatus 100 according to this embodiment performs the determination step of determining the irradiation light amount of the preliminary curing light Lp in the preliminary curing step using the low illuminance light Ls (third light) of an illuminance lower than that of the preliminary curing light Lp (first light). This can accurately determine the irradiation light amount of the preliminary curing light Lp using the shot region on the substrate.

Second Embodiment

The second embodiment of the present invention will be described. The second embodiment basically takes over the first embodiment, and the arrangement of an imprint apparatus 100, the contents of an imprint process, and the like are as described in the first embodiment.

The above-described first embodiment has explained the method of determining the irradiation light amount of the preliminary curing light Lp using a specific shot region selected from the plurality of shot regions on one substrate W. This embodiment will describe a method of determining, in advance, the irradiation light amount of preliminary curing light Lp using the second substrate different from a substrate W for which a preliminary curing step is performed using the preliminary curing light Lp. Furthermore, in this embodiment, the irradiation light amount of the preliminary curing light Lp is individually determined for each of a plurality of shot regions on the substrate W.

The second substrate is, for example, the first substrate of a lot including a plurality of substrates, and can include a plurality of shot regions on which a pattern is to be formed (that is, an imprint process is to be performed). In the imprint process for each of the plurality of shot regions on the second substrate, the above-described determination process using low illuminance light Ls is performed instead of the preliminary curing step, thereby determining the irradiation light amount (for example, an irradiation time Tp) of the preliminary curing light Lp. The irradiation light amount of the preliminary curing light Lp determined using the second substrate can be applied to the imprint process (preliminary curing step) for the second and subsequent substrates W of the lot.

Figure 9:
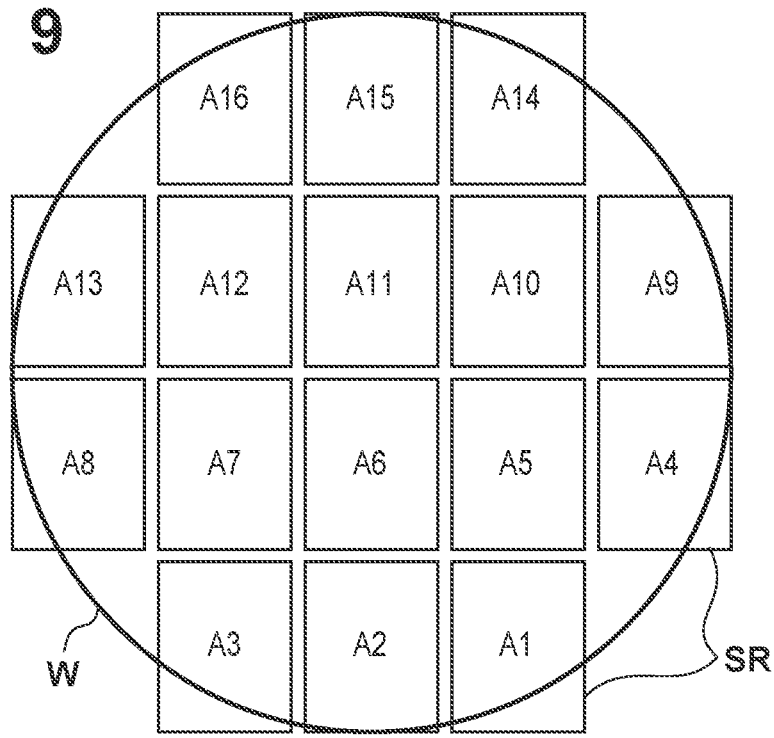
FIG. 9 is a view showing an example of the arrangement of a plurality of shot regions on a substrate.

FIG. 9 is a view showing an example of the arrangement of a plurality of shot regions SR on the substrate W. Referring to FIG. 9, reference symbols A1 to A16 assigned to the respective shot regions SR denote the numbers of the shot regions, which indicate an order in which the imprint process is performed. As shown in FIG. 9, the plurality of shot regions SR include at least two shot regions SR (for example, A1 and A5) different in contact area between a mold M and an imprint material. In the at least two shot regions SR different in contact area, the influence of disturbance (a vibration or the like) is also different, and thus the irradiation light amount of the preliminary curing light Lp is preferably, individually set. Furthermore, in the at least two shot regions SR, an atmosphere at the time of the imprint process, such as an amount of a gas (helium or the like) supplied to the periphery of an imprint material R at the time of the imprint process, is different, and thus the viscosity of the imprint material R at the start of the preliminary curing step is also different. From this viewpoint, for the at least two shot regions SR, the irradiation light amount of the preliminary curing light Lp is preferably, individually set.

Figure 10:
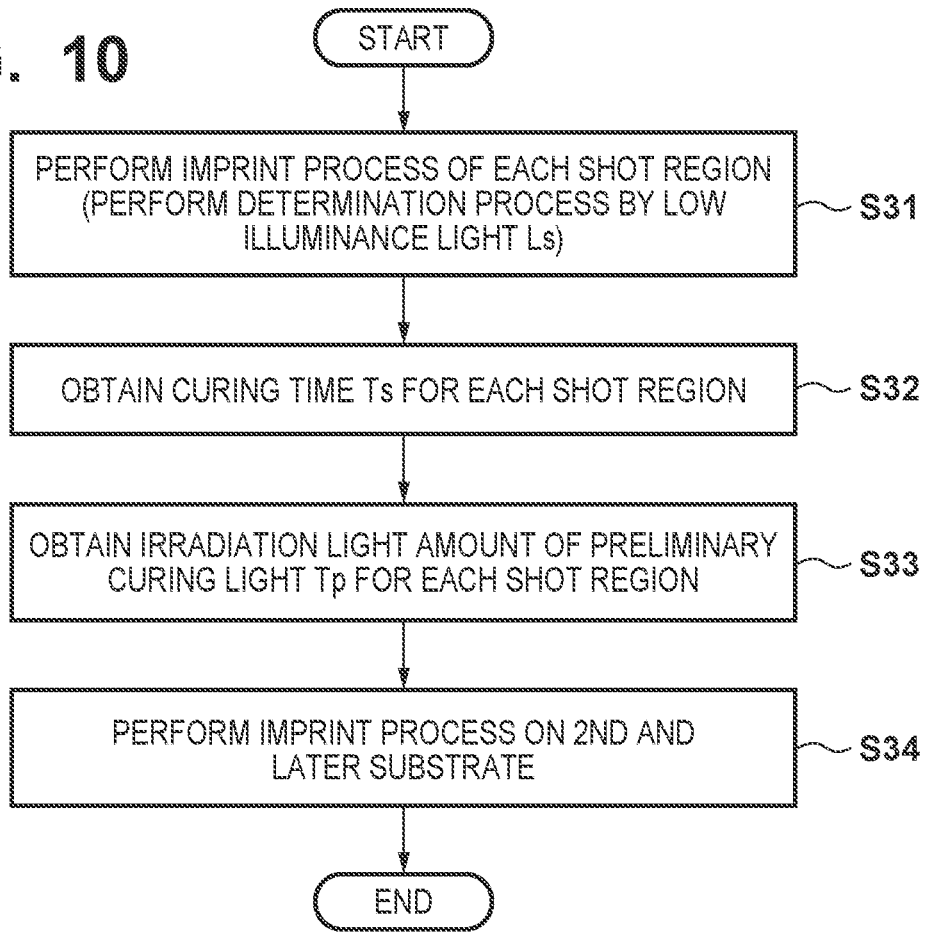
FIG. 10 is a flowchart illustrating an imprint method according to the second embodiment.

FIG. 10 is a flowchart illustrating an imprint method according to this embodiment. Each step of the flowchart shown in FIG. 10 can be controlled by a control unit 70.

In step S31, the control unit 70 performs the imprint process for each of a plurality of shot regions i ("i" represents the number of each shot region) on the second substrate as the first substrate of the lot. The imprint process can be performed in accordance with the flowchart shown in FIG. 2 but the above-described determination process of determining the irradiation light amount of the preliminary curing light Lp using the low illuminance light Ls is performed instead of the preliminary curing step. In step S32, based on the waveform (for example, the waveform shown in FIG. 4) of a relative position obtained in the imprint process of each shot region i, the control unit 70 obtains, for each shot region i, a curing time Ts until the imprint material R is cured to the first target hardness. In step S33, based on the curing time Ts obtained for each shot region i, the control unit 70 determines the irradiation light amount (for example, the irradiation time Tp) of the preliminary curing light Lp for each shot region i. Next, in step S34, the control unit 70 sequentially performs the imprint process for the second and subsequent substrates W of the lot. The imprint process is performed in accordance with the flowchart shown in FIG. 2, and the irradiation light amount of the preliminary curing light Lp determined in step S33 is applied in the preliminary curing step (S14).

The plurality of shot regions on the substrate include shot regions whose contact areas and imprint conditions such as an atmosphere at the time of the imprint process are the same. For example, as shown in FIG. 9, for the shot regions (A5, A6, A7, A10, A11, and A12) arranged in the central portion of the substrate W, the imprint conditions can be the same. Furthermore, for the shot regions A1, A3, A14, and A16 arranged in the peripheral portion of the substrate, the imprint conditions can be the same. If there are shot regions for which imprint conditions are the same, the above-described determination process can be performed for only a specific shot region selected from the shot regions. This makes it possible to adopt, for another shot region, the irradiation light amount of the preliminary curing light Lp determined in the determination process to perform the preliminary curing step using the preliminary curing light Lp. This is thus advantageous in terms of throughput.

Third Embodiment

The third embodiment of the present invention will be described. The third embodiment basically takes over the first and second embodiments, and the arrangement of an imprint apparatus 100, the contents of an imprint process, and the like are as described in the first embodiment.

In the imprint apparatus 100, a set irradiation light amount of preliminary curing light Lp may become unsuitable due to the deterioration of the light source of a preliminary curing unit 41, changes in disturbance conditions such as the temperature and humidity of outside air, and the like. If, for example, the irradiation light amount of the preliminary curing light Lp is large, an imprint material R is cured completely (to the extent that it is impossible to change the relative position between a mold M and a substrate W) in a preliminary curing step, thereby making it difficult to accurately execute alignment between the mold M and the substrate W. On the other hand, if the irradiation light amount of the preliminary curing light Lp is small, the imprint material R is not sufficiently cured to the first target hardness, and receives the influence of disturbance such as a vibration in an alignment step, thereby making it difficult to accurately execute alignment between the mold M and the substrate W. Therefore, the irradiation light amount of the preliminary curing light Lp is preferably corrected (updated) as appropriate. This embodiment will describe a method capable of readily correcting the irradiation light amount of the preliminary curing light Lp.

For example, the illuminance of the light source of the preliminary curing unit 41 and/or the disturbance conditions such as the temperature of outside air are sequentially monitored (watched). Then, if a variation equal to or larger than a predetermined value occurs in the illuminance of the light source and/or the disturbance conditions, the above-described determination process is performed using a specific shot region among a plurality of shot regions. This newly determines an irradiation time Tp (irradiation light amount) of the preliminary curing light Lp, thereby changing the irradiation time Tp for the specific shot region.

On the other hand, the irradiation time Tp (irradiation light amount) of the preliminary curing light Lp for another shot region can be corrected based on the ratio between the irradiation times Tp (irradiation light amounts) before and after the change with respect to the specific shot region. More specifically, when "Tp1" represents the irradiation time Tp before the change with respect to the specific shot region and "Tp2" represents the irradiation time Tp after the change, a correction coefficient Kp for correcting the irradiation time Tp for the other shot region is obtained by Kp=Tp1/Tp2. By obtaining the correction coefficient Kp in this way, the irradiation time Tp for the other shot region can be corrected by, for example, Tp×Kp.

The deterioration of the light source or the variation of the disturbance conditions can be detected by comparing the irradiation time Tp1 before the change with the irradiation time Tp2 after the change. For example, at the time of an imprint process for a specific shot region (for example, the first shot region) of each substrate, the above-described determination process is performed using low illuminance light Ls and the irradiation light amount (irradiation time Tp) of the preliminary curing light Lp is newly determined. Then, by comparing the set irradiation time Tp (Tp1) with the newly determined irradiation time Tp (Tp2), the variation can be detected. More specifically, if the difference or ratio between Tp1 and Tp2 is equal to or larger than a threshold, it is possible to judge that the variation has been detected. If the variation has been detected, the correction coefficient Kp (=Tp1/Tp2) can be obtained and the irradiation time Tp for the other shot region can be corrected by, for example, Tp×Kp, as described above. In this example, in the imprint process of the first shot region as well, it is possible to make a viscosity change moderate, thereby improving the alignment accuracy between the mold M and the substrate W.

<Embodiment of Method of Manufacturing Article>

A method of manufacturing an article according to the embodiment of the present invention is suitable for manufacturing an article, for example, a microdevice such as a semiconductor device or an element having a microstructure. The method of manufacturing an article according to the embodiment includes a step of forming a pattern to an imprint material supplied (applied) onto a substrate by using the above-described imprint apparatus (imprint method) and a step of processing the substrate on which the pattern has been formed in the preceding step. Furthermore, this manufacturing method includes other well-known steps (for example, oxidization, deposition, vapor deposition, doping, planarization, etching, resist removal, dicing, bonding, and packaging, and the like). The method of manufacturing an article according to the embodiment is superior to a conventional method in at least one of the performance, quality, productivity, and production cost of the article.

The pattern of a cured material formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile or nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured material is directly used as the constituent member of at least some of the above-described articles or used temporarily as a resist mask. After etching or ion implantation is performed in the substrate processing step, the resist mask is removed.

Figure 11A:
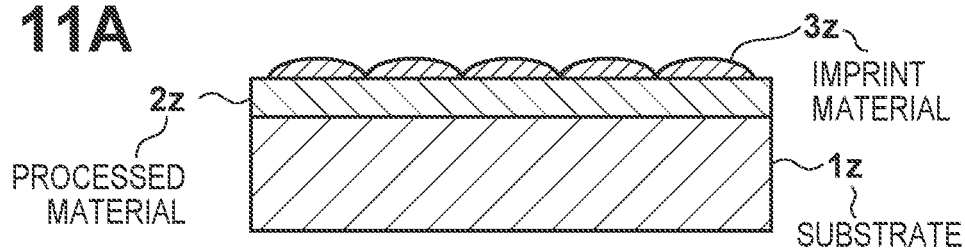
FIGS. 11A to 11F are views for explaining a method of manufacturing an article.

A detailed method of manufacturing an article will be described next. As shown in FIG. 11A, a substrate $1z$ such as a silicon wafer with a target material $2z$ to be processed such as an insulator formed on the surface is prepared. Next, an imprint material $3z$ is applied to the surface of the target material $2z$ by an inkjet method or the like. A state in which the imprint material $3z$ is applied as a plurality of droplets onto the substrate is shown here.

Figure 11B:
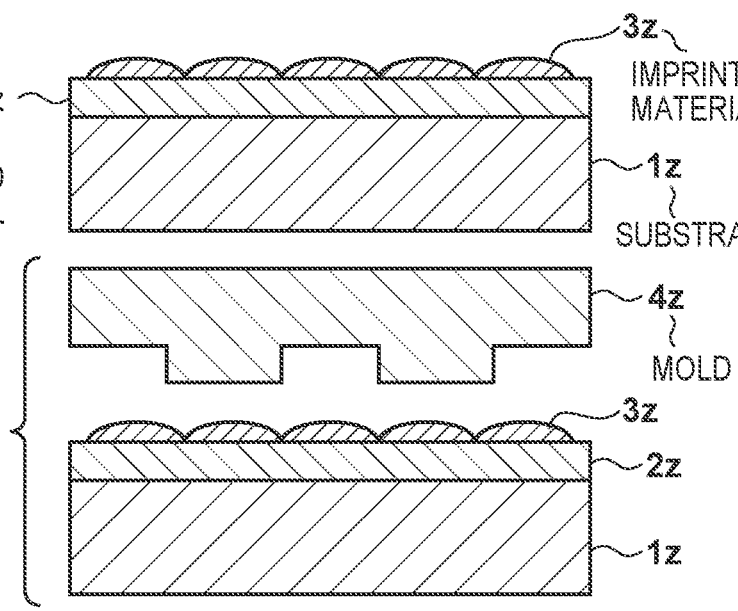
Figure 11C:
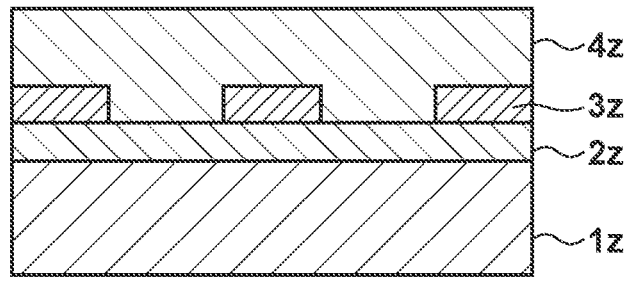

As shown in FIG. 11B, a mold $4z$ for imprint is caused to face to the substrate $1z$ such that a pattern with convex and concave portions formed in the mold $4z$ is directed to the imprint material $3z$ on the substrate $1z$. As shown in FIG. 11C, the mold $4z$ and the imprint material $3z$ applied on the substrate $1z$ are brought into contact with each other, and subjected to a pressure. The gap between the mold $4z$ and the target material $2z$ is filled with the imprint material $3z$. In this state, by irradiating the imprint material $3z$ with energy for curing through the mold $4z$, the imprint material $3z$ is cured.

Figure 11D:
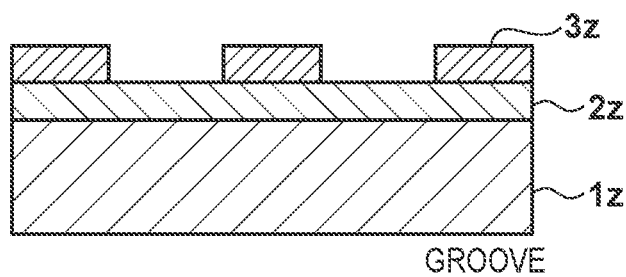

As shown in FIG. 11D, after the imprint material $3z$ is cured, the mold $4z$ is separated from the substrate $1z$. Then, the pattern of the cured material of the imprint material $3z$ is formed on the substrate $1z$. In the pattern of the cured material, the concave portion of the mold corresponds to the convex portion of the cured material, and the convex portion of the mold corresponds to the concave portion of the cured material. That is, the pattern with convex and concave portions in the mold $4z$ is transferred to the imprint material $3z$.

Figure 11E:
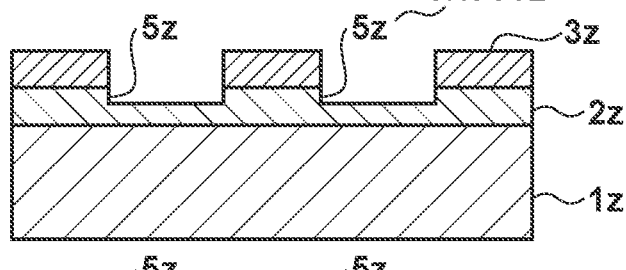
Figure 11F:
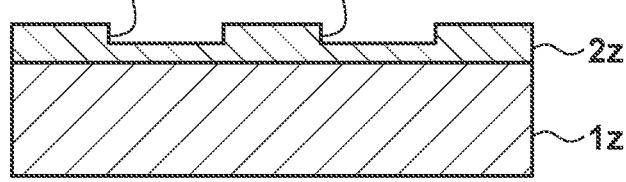

As shown in FIG. 11E, by performing etching process using the pattern of the cured material as an etching resistant mask, a portion of the surface of the target material $2z$ where the cured material does not exist or remains thin is removed to form a groove $5z$. As shown in FIG. 11F, by removing the pattern of the cured material, an article with the grooves $5z$ formed in the surface of the target material $2z$ can be obtained. Here, the pattern of the cured material is removed. However, instead of processing or removing the pattern of the cured material, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-013598 filed on Jan. 29, 2021, which is hereby incorporated by reference herein in its entirety.

What is claimed is:

1. An imprint method of forming a pattern in a first imprint material on a first shot region of a substrate using a mold, comprising:
    obtaining a curing time until a second imprint material on a second shot region is cured to a first target hardness by being irradiated with a third light;
    determining an irradiation amount of a first light, to be used in a preliminary curing of the first imprint material on the first shot region of the substrate, based on the curing time obtained by using the third light to cure the second imprint material to the first target hardness;
    supplying the first imprint material on the first shot region of the substrate;
    bringing the mold into contact with the first imprint material on the first shot region of the substrate;
    performing preliminary curing of the first imprint material on the first shot region of the substrate such that the first imprint material on the first shot region of the substrate is cured to the first target hardness by irradiating the first imprint material with the first light, the first light having an illuminance higher than an illuminance of the third light used to cure the second imprint material to the first target hardness, in order to execute alignment between the mold and the substrate; and
    performing, after the alignment is completed, main curing in which the first imprint material on the first shot region of the substrate is cured to a second target hardness higher than the first target hardness by irradiating the first imprint material with a second light,
    wherein the alignment is executed during at least part of a period from starting irradiation of the first light in the preliminary curing until starting irradiation of the second light in the main curing, and
    the irradiation amount of the first light is determined based on an integrated value of a time of irradiation with the third light which is discretely irradiated to the second shot region until a deviation of a relative position between the mold and the second shot region falls within an allowable range, or an integrated value of a time of irradiation with the third light which is discretely irradiated to the second shot region until a change rate of an amplitude in a waveform of the relative position becomes a target value.

2. The method according to claim 1, wherein the curing time is obtained based on a result of detecting the relative position between the mold and the second shot region while irradiating the second imprint material on the second shot region with the third light.

3. The method according to claim 1, wherein the curing time is obtained based on information acquired by detecting a relative position between the mold and the second shot region while irradiating the second imprint material on the second shot region with the third light, the information indicating a relationship between the relative position and an irradiation time of the third light.

4. The method according to claim 2, wherein the second shot region is a region on the substrate having the first shot region.

5. The method according to claim 2, wherein the second shot region is a region on a different substrate from the substrate having the first shot region.

6. The method according to claim 1, wherein
an irradiation time of the first light in the preliminary curing is determined as the irradiation amount of the first light in the preliminary curing based on the illuminance of the first light, the illuminance of the third light, and the curing time, and
the preliminary curing is performed by irradiating the first imprint material with the first light based on the determined irradiation time.

7. The method according to claim 1, wherein
the substrate includes a plurality of shot regions on each of which the pattern is to be formed, and
the irradiation amount of the first light in the preliminary curing is determined using a specific shot region among the plurality of shot regions as the second shot region and is applied in the preliminary curing for shot regions other than the specific shot region among the plurality of shot regions.

8. The method according to claim 7, wherein the specific shot region is a shot region on which the pattern is to be formed first, among the plurality of shot regions.

9. The method according to claim 1, wherein
the substrate includes a plurality of shot regions on each of which the pattern is to be formed, and
the irradiation amount of the first light in the preliminary curing is individually determined for each of the plurality of shot regions using a second substrate different from the substrate.

10. The method according to claim 7, wherein in a case where the irradiation amount of the first light in the preliminary curing is changed for the specific shot region among the plurality of shot regions, the irradiation amount of the first light in the preliminary curing for another shot region is corrected based on a correction coefficient obtained from a ratio between irradiation amounts before and after the change for the specific shot region.

11. The method according to claim 1, wherein the third light is generated by performing duty control of the first light.

12. The method according to claim 1, wherein the alignment is performed in a state in which the mold and the first imprint material on the substrate are brought in contact with each other, during at least part of the period.

13. A method of manufacturing an article, the method comprising:
forming a pattern on a substrate by using an imprint method according to claim 1;
processing the substrate, on which the pattern has been formed, to manufacture the article.

14. The method according to claim 1, wherein a period in which the alignment is performed includes a period, in which the first imprint material on the substrate is not irradiated with light, between the preliminary curing and the main curing.

15. The method according to claim 1, wherein the illuminance of the first light during the preliminary curing is set to a constant value, and the illuminance of the third light, while the second imprint material is irradiated with the third light for obtaining the curing time, is set to a constant value.

16. The method according to claim 1, wherein the second imprint material has the same composition as the first imprint material.

17. The method according to claim 1, wherein the illuminance of the third light is set to a value within a range of 5% to 50% of the illuminance of the first light.

* * * * *